US006586284B2

United States Patent
Kim

(10) Patent No.: US 6,586,284 B2
(45) Date of Patent: Jul. 1, 2003

(54) SILICON-ON-INSULATOR (SOI) SUBSTRATE, METHOD FOR FABRICATING SOI SUBSTRATE AND SOI MOSFET USING THE SOI SUBSTRATE

(75) Inventor: Min-su Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/186,509

(22) Filed: Jul. 1, 2002

(65) Prior Publication Data

US 2002/0163041 A1 Nov. 7, 2002

Related U.S. Application Data

(62) Division of application No. 09/803,309, filed on Mar. 9, 2001, now Pat. No. 6,437,405.

(30) Foreign Application Priority Data

Mar. 30, 2000 (KR) .......................................... 2000-16533

(51) Int. Cl.⁷ .............................................. H01L 21/00
(52) U.S. Cl. ....................... 438/149; 438/294; 438/295; 438/304; 257/74; 257/211; 257/278; 257/347; 257/352; 257/407
(58) Field of Search ........................... 257/74, 211, 278, 257/347, 352, 407; 438/294, 295, 304

(56) References Cited

U.S. PATENT DOCUMENTS 5,872,383 A * 2/1999 Yagishita .................... 257/409
5,889,293 A * 3/1999 Rutten et al. ................. 257/74
6,218,248 B1 * 4/2001 Hwang et al. ................ 438/294

* cited by examiner

Primary Examiner—David Nelms
Assistant Examiner—Mai-Huong Tran
(74) Attorney, Agent, or Firm—Mills & Onello LLP

(57) ABSTRACT

The present invention relates to a silicon-on-insulator (SOI) substrate, a method for fabricating the SOI substrate and a SOI MOSFET using the SOI substrate to easily migrate the design applied to a conventional bulk silicon substrate to the SOI design and to remove a floating body effect. The SOI substrate includes a mono-silicon substrate, a buried oxide layer formed over the surface of the mono-silicon substrate, and a thin mono-silicon layer formed over the surface of the buried oxide layer. Conductive layers are formed at through holes of the buried oxide layer positioned between the predetermined regions of the thin layer and the substrate for body contacts. Therefore, additional layout spaces are not needed for body contacts and the constant body contact resistance can allow the conventional circuit design applied to die bulk silicon substrate to be migrated to the circuit design applied to the SOI substrate without any modifications. Also, a variety of operational failures caused by the floating effect can be eliminated in die SOI substrate. As a consequence, additional effort is not required for designing or verifying the circuit of the present invention, so as to make it possible to construct a highly efficient, but low power consuming system.

4 Claims, 3 Drawing Sheets

SILICON-ON-INSULATOR (SOI) SUBSTRATE, METHOD FOR FABRICATING SOI SUBSTRATE AND SOI MOSFET USING THE SOI SUBSTRATE

RELATED APPLICATIONS

This application is a divisional of copending U.S. application Ser. No. 09/803,309, filed on Mar. 9, 2001 now U.S. Pat. No. 6,437,405, the contents of which are incorporated herein in their entirety by reference.

BACKGROUND OF THE INVENTION

1. Field of the Invention

The present invention relates to a silicon-on-insulator (SOI) and more particularly to a SOI substrate, a method for fabricating the SOI substrate and a SOI MOSFET using the SOI substrate to remove a floating body effect without a separate layout space.

2. Description of Related Art

In general, a wide isolation region is required in the process for fabricating complementary metal oxide semiconductor (CMOS) transistors to prevent latch-up of the CMOS transistors and to isolate the transistors. However, the wide isolation region results in larger size aid low integration of a semiconductor device. In order to solve the aforementioned problem, a SOI technique has been disclosed to fabricate a SOI transistor, which has proved to be superior to a bulk silicon transistor by providing a lower power consumption rate and in an application to a performance VLSI.

FIG. 1 is a schematic cross-sectional view of a conventional SOI CMOS transistor. As shown in FIG. 1, the conventional SOI CMOS transistor includes a buried oxide layer 12 on a mono-silicon substrate 10; a N-type mono-silicon layer 14 for a P type transistor, a P-type mono-silicon layer 16 for a N type transistor and an isolation layer 18 for separating those layers on die buried oxide layer. A gate oxide layer is inserted to a predetermined part of the thin layer 14 to form a gate electrode 20. A lightly doped drain (LDD) structure of source/drain regions is formed at both sides of the gate electrode 20 in the thin layer 14. Also, a gate oxide layer is inserted at a predetermined part of the thin layer 14 to form a gate electrode 22. An LDD structure of source/drain regions is formed at both sides of the gate electrode 22 in the thin layer 16.

In the conventional SOI CMOS transistor thus constructed, there is a reduction in the junction areas between the source/drain region of the P type transistor and the body region 15 and between the source/drain region of the N type transistor and the body region 17 to reduce junction capacitance in these source/drain regions. In addition, the P and N type transistors are isolated by the isolation layers 18, so that there is no problem like latch-up. Accordingly, the SOI CMOS transistor can be superior to the bulk silicon CMOS transistor in rapid and stable operations of a circuit. Also, the body regions 15, 17 of the thin layers 14, 16 are not electrically connected, but floated to eliminate the reverse body effect, which increase the operational speed of the circuit.

However, the floating body regions 15, 17 may cause fluctuations in voltage, which leads to many problems such as a kink effect, low breakdown voltage of a drain due to a parasitic horizontal bi-polar transistor, dynamic leakage of current and an output characteristic of history dependence and instability in the SOI CMOS transistor.

In order to solve the aforementioned problems, there have been disclosed many methods, one of which is a body contact to fix the unstably operating body regions at a specific level of voltage. An effective body contact should result in a low resistance. Unfortunately, it is quite difficult to make an effective body contact in the SOI CMOS transistor, and a H type body contact is the most frequently used one at present. However, if the width of channels increases in the H type body contact, the resistance of the body contact also increases. Thus, it is difficult to effectively set the unstable body region at a specific level of voltage. Because the resistance of the body contact varies along with changes in the width of channels, great efforts should be made in designing and verifying the circuit. Since a modification and insertion of an additional separate space are required for designing the H type body contact on the conventional bulk silicon substrate, it will not be easy to make a migration from the CMOS transistor applied to the bulk silicon substrate to the SOI CMOS transistor in the designing step. Even if various types of body contacts have been suggested in addition to the H type body contact in recent years, the newly suggested body contacts have exhibited operational failures or many other problems in the fabricating processes, similar to or worse than the H type body contact.

SUMMARY OF THE INVENTION

Therefore, it is an object of the invention to provide a SOI substrate, a method for fabricating the SOI substrate and a SOI MOSFET using the SOI substrate to migrate the design applied to a conventional bulk silicon substrate to the SOI design and to eliminate a floating body effect.

According to one aspect of the invention, there is provided a SOI substrate which includes a mono-silicon substrate and a buried oxide layer formed over the entire surface of the mono-silicon substrate. A thin mono-silicon layer is formed over the entire surface of die buried oxide layer, and conductive layers are formed at through holes of the buried oxide layer positioned between the predetermined regions of the thin layer and the substrate for body contacts.

Preferably, the conductive layers can be made of heavily doped mono-silicon or poly-silicon or metal. For instance, the conductive layers can be made of tungsten.

In another aspect of the invention, there is provided a method for fabricating a SOI substrate. First and second mono-silicon substrates are provided, and a buried oxide layer is formed over the entire surface of the second substrate. An ion implantation layer is formed to be positioned at a predetermined distance internally apart from die surface of the second substrate to restrict a mono-silicon thin layer between the buried oxide layer and the ion implantation layer. Through holes are formed at the buried oxide layer at respective predetermined areas of the thin layer. Conductive layers are formed at the through holes for body contacts of the thin layer. The first and second substrates at both sides of the buried oxide layer are combined, and the first substrate is detached from the thin layer using the ion implantation layer.

The step of forming die conductive layers may further include forming conductive layers on die buried oxide layer to fill up the though holes and levelling off the conductive layers of the though holes with the buried oxide layer.

The conductive layer can be made of heavily doped mono-silicon, poly-silicon or metal. Specifically, the conductive layer can be made of tungsten. The conductive layer can also be made into a mono-silicon layer formed by an epitaxial growth.

In accordance with another aspect of the present invention, there is provided a SOI MOSFET. The MOSFET includes a first conductivity mono-silicon substrate having a second conductivity well region and a second conductivity remaining region of a first conductive layer. A oxide layer is formed over the entire surface of the substrate. A first conductivity thin mono-silicon layer is formed on the buried oxide layer positioned at a predetermined part of the remaining substrate. A second conductivity thin mono-silicon layer is formed on the buried oxide layer positioned at a predetermined part of the well region of the substrate. An isolation layer is formed on the buried oxide layer between the first and second thin layers for separation. A first conductive layer is formed at the through hole of the buried oxide layer under a part of the first thin layer for the body contact of the first thin layer. A second conductive layer is formed at the through hole of the buried oxide layer under a part of the second thin layer for the body contact of the first thin layer. A first transistor is formed on the first thin layer, and a second transistor is formed on the second thin layer.

In one embodiment, the SOI MOSFET includes first voltage supply means formed at the through hole of the isolation layer and the buried oxide layer positioned at a predetermined part of the remaining area of the substrate. Second voltage supply means is formed at the through hole of the isolation layer and the buried oxide layer positioned at a predetermined part of a well region.

The first voltage supply means can be constructed with a third conductive layer in the through hole of the buried oxide layer and a fifth conductive layer in the through hole of the isolation layer. Also, the second voltage supply means can be constructed with a fourth conductive layer in the through hole of the buried oxide layer and a sixth conductive layer in the through hole of the isolation layer. The first voltage supply means can have a seventh conductive layer in the through hole of the buried oxide layer and the isolation layer, and the second voltage supply means can have an eighth conductive layer in the through hole of the buried oxide layer and the isolation layer. A first conductive plug is formed to reduce resistance at the remaining area under the first conductive layer and the first voltage supply means, and a second conductive plug is formed to reduce resistance at the well region under the second conductive layer and die second voltage supply means. In one embodiment, the first voltage supply means is for voltage Vss, and the second voltage supply means is for voltage $V_{DD}$.

In one embodiment, the first, second, third and fourth conductive layers are made of an identical material. The material can be heavily doped mono-silicon, poly-silicon or metal. The first and third conductive layers can be made of the first conductivity type of mono-silicon or poly-silicon layer, and the second and fourth conductive layers can be made of the second conductivity of mono-silicon or poly-silicon layer. The metal layer can be made of tungsten. The fifth and sixth conductive layers can be made of the same material, but different from the first, second, third and fourth conductive layers. The seventh and eighth conductive layers can be made of the same material, but different from the first and second conductive layers. The fifth, sixth, seventh and eighth conductive layers can be made of metal layers of aluminum or copper.

In accordance with the invention, conductive layers are formed on the buried oxide layer between the active regions of thin layers and the substrate to eliminate the floating body effect without a separate layout space. In addition, since there is a constant body contact resistance regardless of changes in the length and width of channels in the SOI MOSFET, no great effort is required to design and verily the SOI circuit. That is, it is easier to make a migration from the bulk silicon substrate to the SOI substrate without any specific modification in design.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Preferred embodiments of the SOI substrate, the method for fabricating the SOI substrate and the SOI MOSFET of the invention will now be described in detail with reference to the accompanying drawings.

Figure 1:
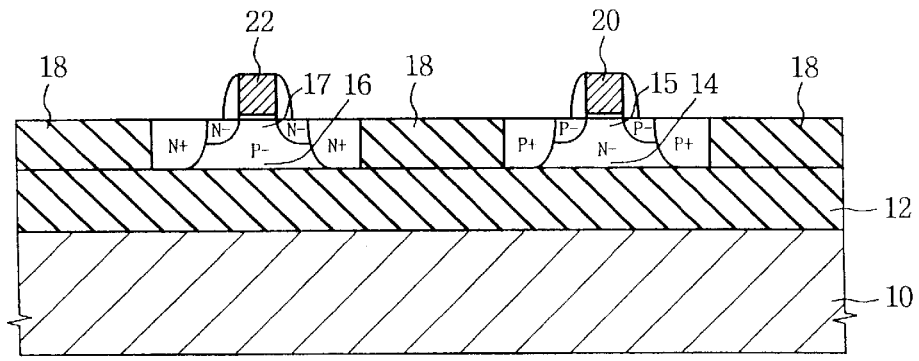
FIG. 1 is a schematic cross-sectional view illustrating the structure of MOSFET using a conventional SOI substrate.
Figure 2:
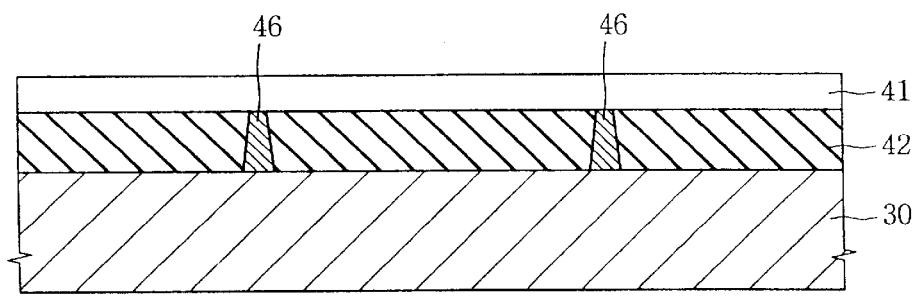
FIG. 2 is a schematic cross-sectional view illustrating the structure of a SOI substrate in accordance with one embodiment of the present invention.

FIG. 2 is a cross-sectional view illustrating the structure of a SOI substrate, and FIGS. 3 through 6 are cross-sectional views illustrating a method for fabricating the SOI substrate in accordance with the present invention. As shown in FIG. 2, the SOI substrate includes a mono-silicon substrate 30, a buried oxide layer 42 formed over the entire surface of the mono-silicon substrate 30, and a thin mono-silicon layer 41 formed over the entire surface of the buried oxide layer 42. Conductive layers 46 are formed at through holes of the buried oxide layer 42 positioned between the predetermined regions of the thin layer 41 and the substrate 30 for body contacts. The conductive layers 46 can be made a heavily doped mono-silicon layer, a poly-silicon layer or a metal layer like tungsten.

Figure 3:
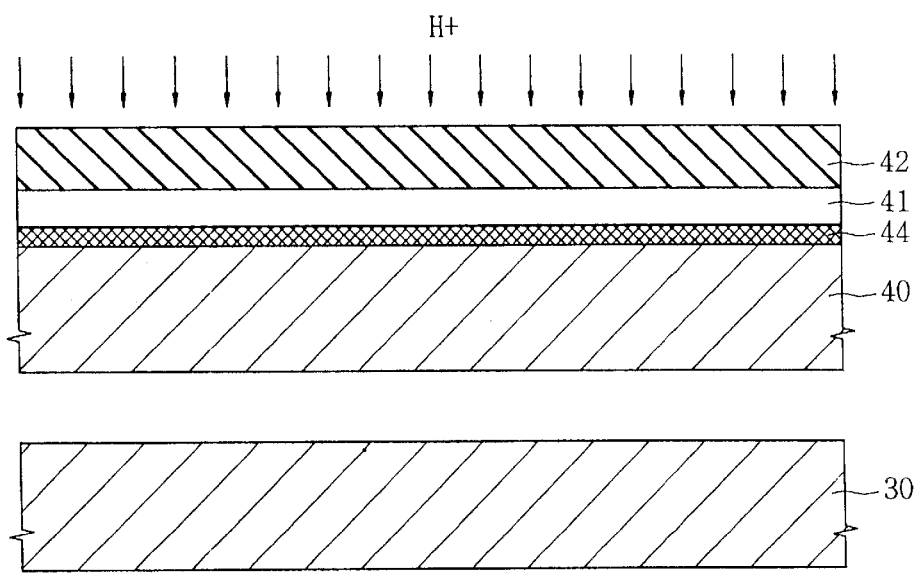
FIGS. 3 through 6 are schematic cross-sectional views illustrating a method for fabricating a SOI substrate in accordance with the present invention.

A method for fabricating the SOI substrate thus constructed will be described. As shown in FIG. 3, firstly, first and second mono-silicon substrates 30, 40 are set up. At this time, the first and second substrates 30, 40 can be made of the same conductivity type of substrates, for instance, a P type substrate. Then, a buried oxide layer 42 is formed over the entire surface of the second substrate 40 by a conventional process to a thickness of 1000–4000 Å. An ion implantation process is applied to form an ion implantation layer 44, for instance, a hydrogen ion implantation layer, at a predetermined distance internally apart from the surface of the substrate 40 to restrict a mono-silicon thin layer 41 between the buried oxide layer 42 and the ion implantation layer 44. The ion implantation layer 44 is formed to separate the thin layer 41 from the second substrate 40 in the following process steps.

Figure 4:
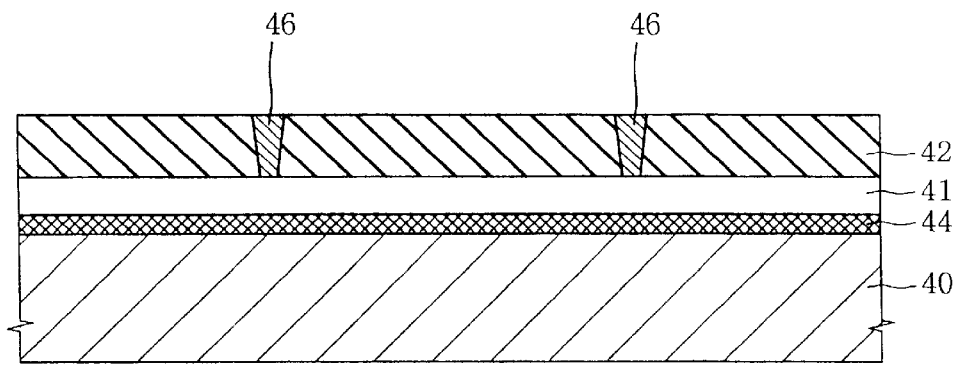

As shown FIG. 4, after complete formation of the thin layer 41, a photo etching process is applied to form through holes 43 at some predetermined positions, for instance, to expose the thin layer 41 for the body contact under the buried oxide layer 42. Next, a conductive layer 46 is deposited over buried oxide layer 42 thick enough to fill up the through holes 43. The conductive layer 46 may be made of a heavily doped mono-silicon layer, a poly-silicon layer or a metal layer of tungsten.

Then, a chemical mechanical polishing process is applied to leave the conductive layer 46 only in the through holes 43 and remove it on the buried oxide layer 42 outside of the through holes 43. As a result, the conductive layer 46 of the through holes 43 is leveled with the buried oxide layer 42.

Figure 5:
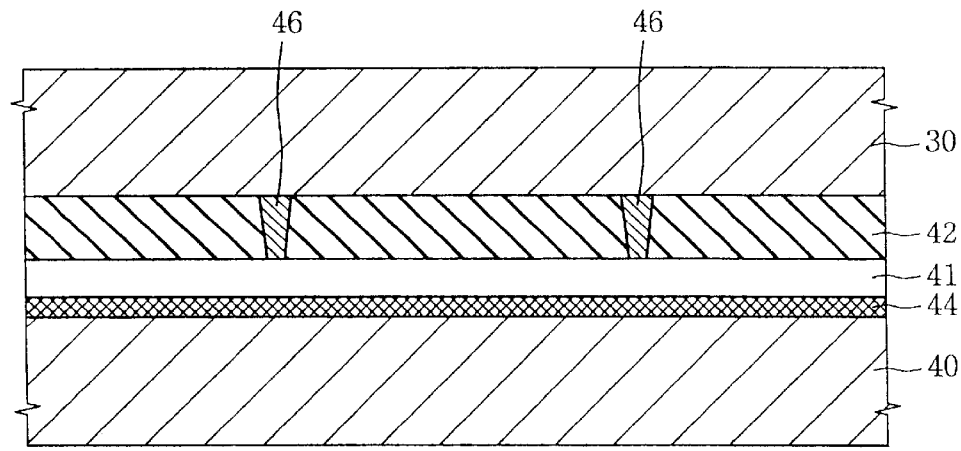
Figure 6:
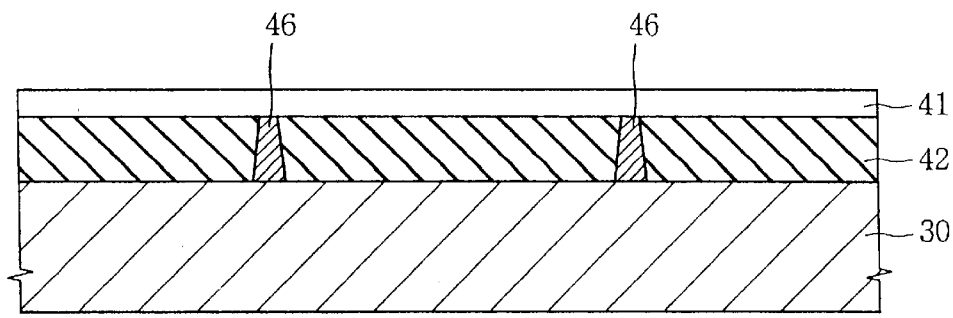

As shown in FIG. 5, after complete formation of the conductive layer 46, a conventional junction process is applied to combine the prepared first substrate 30 with the buried oxide layer 42 of the second substrate 40. As shown in FIG. 6, after complete formation of the first and second substrates 30, 20, they are heated at the temperature of 400~600 degrees centigrade to detach the second substrate 30 from the thin layer 41. Then, the first substrate 30 is placed upside down. The first substrate 30 is then annealed at the temperature of 1100 to reinforce the bonding force of the junction part between the first substrate 30 and the buried oxide layer 42, thereby completing the SOI substrate 50 of the present invention.

Figure 7:
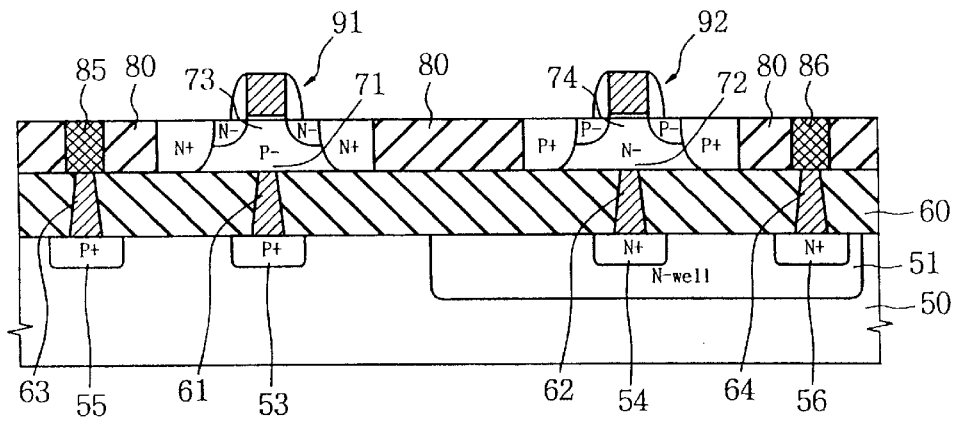
FIG. 7 is a schematic cross-sectional view illustrating the structure of a SOI MOSFET in accordance with an embodiment of the present invention.

FIG. 7 is a cross-sectional view illustrating the structure of a SOI MOSFET in accordance with one embodiment of the present invention. As shown in FIG. 7, the substrate 50 is made of the first conductivity type of mono-silicon, for instance, P type mono-silicon. The second conductivity type of a well region 51, N type, at a predetermined part of the substrate 50, and a buried oxide layer 60 is formed over all the surface of the substrate 50. On the buried oxide layer 60 positioned at a predetermined remaining part of the substrate 50 except the well region 51, a first thin layer 71 is made of a P type mono-silicon. A second thin layer 72 is made of N type mono-silicon on the buried oxide layer 60 positioned at a predetermined part of the well region 51. An isolation layer 80 is formed on the buried oxide layer 60 between the first and second thin layers 71, 72 for isolation. Then, a first conductive layer 61 is formed at the through hole of the buried oxide layer 60 positioned under a predetermined part of the first thin layer 71, and a second conductive layer 62 is formed at the through hole of the buried oxide layer 60 positioned under a predetermined part of the second thin layer 72 for the body contact. A first transistor 91, an N type transistor having a LDD source/drain structure, is formed at the first thin layer 71. A second transistor 92, a P type transistor having a LDD source/drain structure, is formed at the second thin layer 72. It should be noted that the first and second conductive layers 61, 62 are separately illustrated in the drawing for convenient description. If the channel area for the first and second transistors 91, 92 is large, the surface uniformity of the contact gets poor. In order to prevent deterioration of the surface uniformity of the contact, the first and second conductive layers 61, 62 can be respectively formed as several contact clusters.

Figure 8:
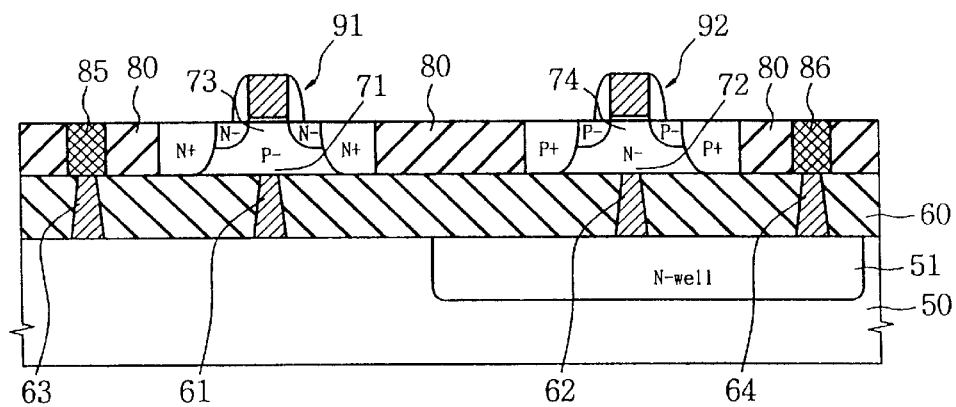
FIG. 8 is a schematic cross-sectional view illustrating the structure of a SOI MOSFET in accordance with another embodiment of the present invention.

In addition, the first voltage supply means is formed at the through hole of the isolation layer 80 and the buried oxide layer 60 positioned at a predetermined remaining part of the substrate 50, and the second voltage supply means is formed at the through hole of the isolation layer 80 and buried oxide layer 60 positioned at a predetermined part of the well region 81 of the substrate 50. The first voltage supply means is constructed with the third conductive layer 63 in the through hole of the buried oxide layer 60 and the fifth conductive layer 85 in the through hole of the isolation layer 80. The second voltage supply means is also constructed with the fourth conductive layer 64 in the through hole of the buried oxide layer 60 and the sixth conductive layer 86 in the through hole of the isolation layer 80. At the remaining part of the substrate positioned under the first and third conductive layers 61, 63, P+ type plugs 53, 55 are formed to reduce resistance between the first and third conductive layers 61, 63 and the substrate 50. At the well region 51 positioned under the second and fourth conductive layers 62, 64, N+ type plugs 54, 56 are formed to reduce resistance between the second and fourth conductive layers 62, 64 and the well region 51. As shown in FIG. 8, the P+ type plugs 53, 55 may not be formed at the remaining area of the substrate 50 positioned under the first and third conductive layers 61, 63, and the N+ type plugs 54, 56 may not be formed at the well area 51 positioned under the second and fourth conductive layers 62, 64.

The first, second, third and fourth conductive layers 61, 62, 63, 64 can be a mono-silicon layer, a poly-silicon layer or a metal layer of tungsten. The fifth and sixth conductive layers 85, 86 may be a metal layer of aluminum or copper. The first and third conductive layers 61, 63 can be P+ type mono-silicon or poly-silicon layers. The second and fourth conductive layers 62, 64 can be N+ type mono-silicon or poly-silicon layers. The first voltage supply means is for Vss voltage, and the second voltage supply means is for $V_{DD}$ voltage.

Figure 9:
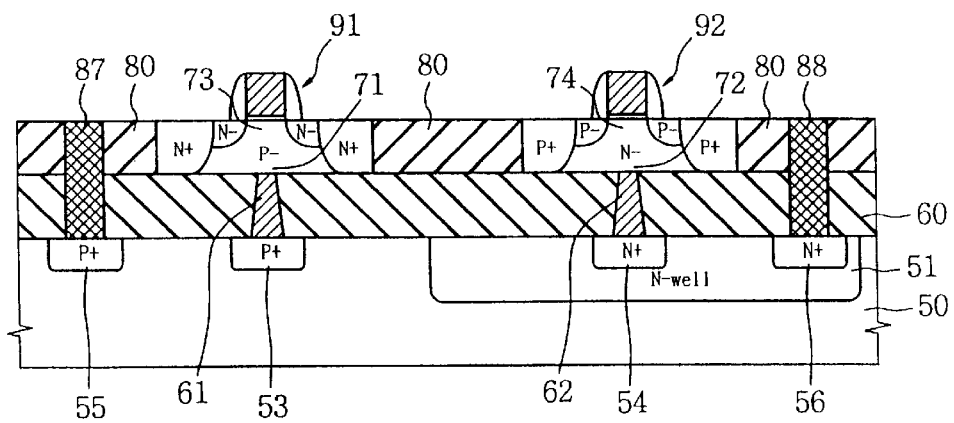
FIG. 9 is a schematic cross-sectional view illustrating the structure of a SOI MOSFET in accordance with another embodiment of the present invention.

As shown in FIG. 9, the first voltage supply means is the seventh conductive layer 87 formed in the through hole of the buried oxide layer 60 and the isolation layer 80, and the second voltage supply means is the eighth conductive layer 88 formed in the through hole of the buried oxide layer 60 and the isolation layer 80. The seventh and eighth conductive layers 87, 88 can be made metal layers of aluminum or copper.

In the SOI MOSFET thus constructed, the conductive layer 61 for the body contact is positioned between the body region 71 of the N type transistor 91 and the substrate 50, and the conductive layer 62 for the body contact is positioned between the body region 72 of the P type transistor 92 and the N well region 51 of the substrate 50. As a result, separate layout spaces are not needed for the body contact. Also, there is a constant body contact resistance regardless of any changes in the length or width of the channel in the N type and P type transistors 91, 92.

Therefore, it is easy to migrate to the circuit design applied to a SOI substrate without any modifications to the conventional circuit design applied to the bulk silicon substrate. In consequence, no additional effort will be needed to design or verify the SOI circuit in the present invention, so as to be able to construct a highly efficient, low power consuming system within a short period of time.

As described above, the buried oxide layer is formed on the mono-silicon substrate, and thin mono-silicon layers are placed apart with an isolation layer in the middle thereof on the buried oxide layer. Conductive layers are respectively formed on the buried oxide layer between the thin layers and the substrates for body contacts, and P and N type transistors are formed on the thin layers.

In consequence, there are advantages in the present invention in that additional layout spaces are not needed for body contacts and the constant body contact resistance can allow the conventional circuit design applied to the bulk silicon substrate to be migrated to the circuit design applied to the SOI substrate without any modification. Also, the present invention is advantageous in removing a variety of operational failures caused by the floating body effect. Additional effort is not required for designing or verifying the circuit of the present invention, so as to make it possible to construct a highly efficient, but low power consuming system.

While this invention has been particularly shown and described with references to preferred embodiments thereof, it will be understood by those skilled in the art that various changes in form and details may be made therein without departing from die spirit and scope of the invention as defined by the following claims.

What is claimed is:

1. A method for fabricating a SOI substrate comprising the steps of:

providing first and second mono-silicon substrates;

forming a buried oxide layer over the surface of the second substrate;

forming an ion implantation layer positioned at a predetermined distance internally apart from the surface of the second substrate to restrict a mono-silicon thin layer between the buried oxide layer and the ion implantation layer;

forming through holes at the buried oxide layer on predetermined respective areas of the thin layer;

forming conductive layers at the through holes for the body contacts of the thin layer;

combining the first and second substrates at both sides of the buried oxide layer; and detaching the first substrate from die thin layer using the ion implantation layer.

2. The method, as defined in claim 1, wherein the step of forming the conductive layers further comprises:

forming the conductive layers on the buried oxide layer to fill the though holes; and levelling the conductive layers of the though holes with die buried oxide layer.

3. The method, as defined in claim 1, wherein the conductive layers are made of one of heavily doped mono-silicon, poly-silicon and metal.

4. The method, as defined in claim 3, wherein the conductive layer is made of tungsten.

* * * * *

UNITED STATES PATENT AND TRADEMARK OFFICE
CERTIFICATE OF CORRECTION

PATENT NO.     : 6,586,284 B2
DATED          : July 1, 2003
INVENTOR(S)    : Min-su Kim It is certified that error appears in the above-identified patent and that said Letters Patent is hereby corrected as shown below:

<u>Column 8,</u>
Line 9, please delete "die" and insert -- the --.
Line 16, please delete "die" and insert -- the --.

Signed and Sealed this

Twenty-fifth Day of November, 2003

JAMES E. ROGAN
*Director of the United States Patent and Trademark Office*